(12) United States Patent
Clift

(10) Patent No.: US 7,194,500 B2
(45) Date of Patent: Mar. 20, 2007

(54) SCALABLE GRAY CODE COUNTER

(75) Inventor: Graham Clift, Poway, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 748 days.

(21) Appl. No.: 10/617,494

(22) Filed: Jul. 11, 2003

(65) Prior Publication Data
US 2005/0017753 A1    Jan. 27, 2005

(51) Int. Cl.
G06F 7/50 (2006.01)
G06F 7/00 (2006.01)

(52) U.S. Cl. ...................... 708/672; 708/200
(58) Field of Classification Search ........ 708/670–672, 708/200, 160, 301; 710/52, 57
See application file for complete search history.

(56) References Cited

U.S. PATENT DOCUMENTS

| | | | |
|---|---|---|---|
| 3,349,332 A | 10/1967 | Bleickardt | |
| 3,588,461 A | 6/1971 | Haisall | |
| 4,519,091 A | 5/1985 | Chu et al. | |
| 4,780,894 A | 10/1988 | Watkins et al. | |
| 4,937,845 A | 6/1990 | Warner | |
| 5,045,854 A | 9/1991 | Windmiller | |
| 5,084,841 A | 1/1992 | Williams et al. | |
| 5,164,968 A * | 11/1992 | Otto | 377/34 |
| 5,191,425 A * | 3/1993 | Hachiyama et al. | 348/222.1 |
| 5,426,756 A | 6/1995 | Shyi et al. | |
| 5,428,654 A | 6/1995 | Baqai | |
| 5,960,468 A | 9/1999 | Paluch | |
| 5,987,574 A | 11/1999 | Paluch | |
| 6,084,935 A | 7/2000 | Mather | |
| 6,337,893 B1 | 1/2002 | Pontius | |
| 6,359,897 B1 | 3/2002 | Hessel et al. | |
| 6,400,735 B1 * | 6/2002 | Percey | 708/301 |
| 6,434,642 B1 * | 8/2002 | Camilleri et al. | 710/57 |
| 6,457,114 B1 | 9/2002 | Paluch | |
| 6,473,484 B1 | 10/2002 | Mather | |
| 6,553,448 B1 | 4/2003 | Mannion | |
| 6,556,645 B2 | 4/2003 | Kim | |
| 6,845,414 B2 * | 1/2005 | Hsu et al. | 710/52 |
| 2003/0177295 A1 * | 9/2003 | Hsu et al. | 710/200 |

OTHER PUBLICATIONS

Ivo Viscor, Gray counter in VHDL, Proceedings of the Student FEI 2000, Brno 2000, pp. 399-401.*
Atul et al., Trading off Reliability and Power-Consumption in Ultra-Low Power Systems, IEEE, Proceedings of the International Symposium on Quality Electronic Design, 2002, pp. 1-6.*

(Continued)

Primary Examiner—Meng-Al T. An
Assistant Examiner—Chat C. Do
(74) Attorney, Agent, or Firm—John L. Rogitz

(57) ABSTRACT

The invention is a Gray code counter that uses a carry chain to determine the state of each bit of the counter. An additional bit that toggles at every clock is used to originate the carry chain, and to determine the counter direction. Then, a generic Gray count bit module is used to process the carry and count chain for each bit of the counter. Special consideration is given to the first and last bits of the counter to ensure correct termination and reset of the counter. A one bit gray code generic module is described such that a scalable counter can be generated recursively.

19 Claims, 3 Drawing Sheets

- Gray Counter One Stage

OTHER PUBLICATIONS

Jian et al., A High-Resolution Time-to-Digital Converter Implemented in Field-Programmable-Gate-Arrays, IEEE Transactions on Nuclear Science, vol. 53, No. 1, Feb. 2006, pp. 236-241.*

Robert et al., 32-Channel Digital 6-bit TDC with 2.5 ns Least Count, IEEE Transactions on Nuclear Science, vol. 36, No. 1, Feb. 1989, pp. 646-649.*

* cited by examiner

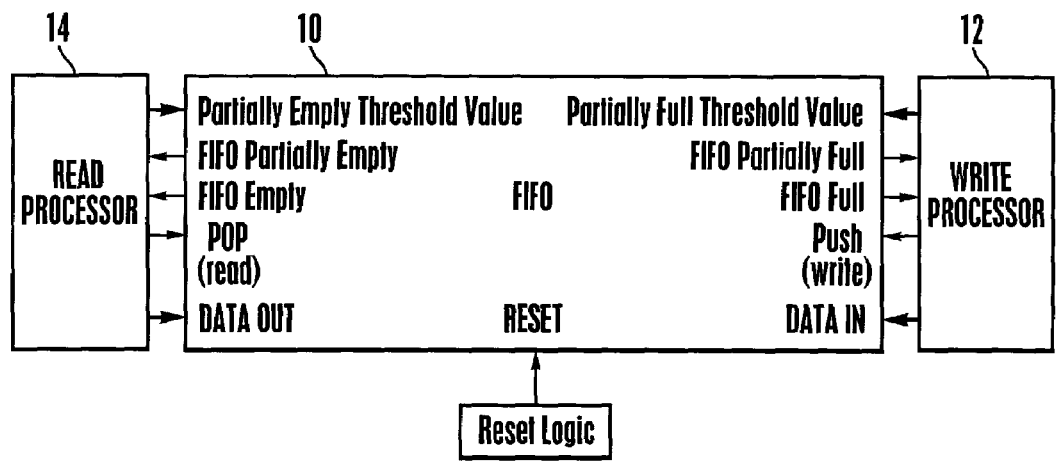
Fig. 1
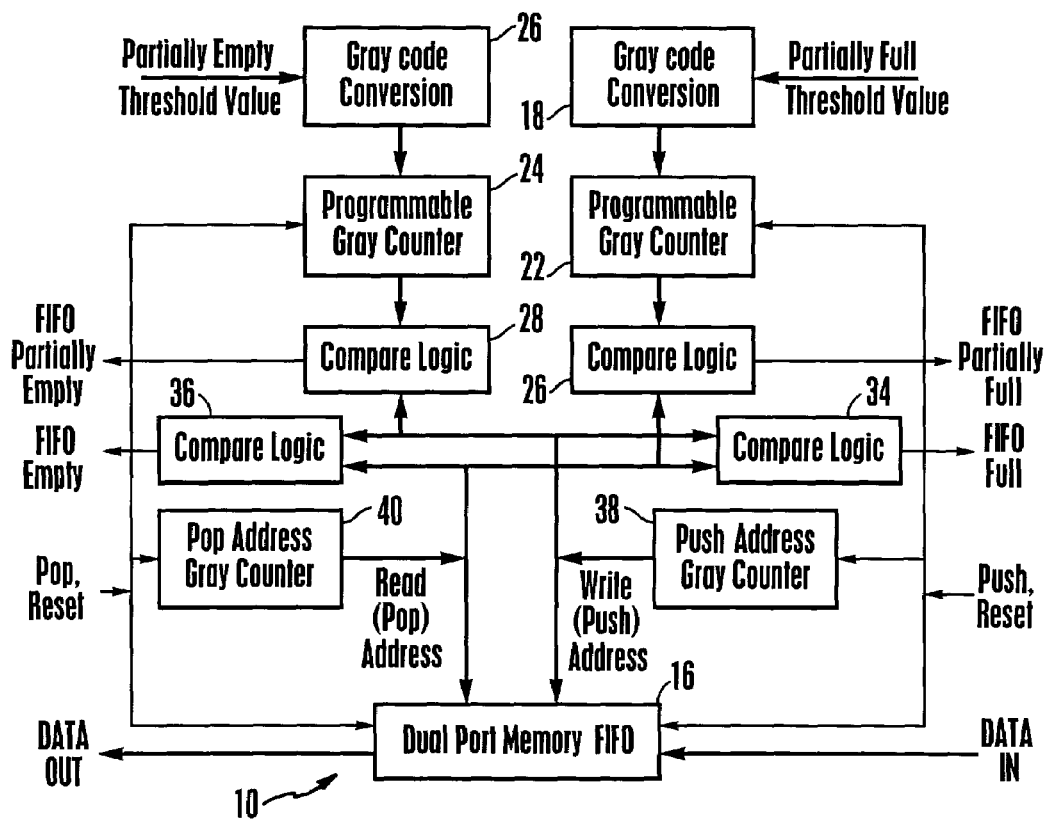
Fig. 2 FIFO

Fig. 3 - Gray Counter One Stage

| Decimal Change | Gray_count(n') 3 2 1 0 | Gray_count(n) 3 2 1 0 | Carry_count(n) 3 2 1 0 |
|---|---|---|---|
| 0 to 1 | 0 0 0 1 | 0 0 0 0 | 0 0 0 0 |
| 1 to 2 | 0 0 [1] 1 | 0 0 0 [1] | 0 0 0 [1] |
| 2 to 3 | 0 0 1 0 | 0 0 1 1 | 0 0 0 0 |
| 3 to 4 | 0 [1] 1 0 | 0 0 [1] 0 | 0 0 [1] 1 |
| 4 to 5 | 0 1 1 1 | 0 1 1 0 | 0 0 0 0 |
| 5 to 6 | 0 1 0 1 | 0 1 1 [1] | 0 0 0 [1] |
| 6 to 7 | 0 1 0 0 | 0 1 0 1 | 0 0 0 0 |
| 7 to 8 | [1] 1 0 0 | 0 [1] 0 0 | [1] 1 1 |
| 8 to 9 | 1 1 0 1 | 1 0 0 0 | 0 0 0 0 |
| 9 to 10 | 1 1 [1] 1 | 1 1 0 [1] | 0 0 0 [1] |
| 10 to 11 | 1 1 1 0 | 1 1 1 1 | 0 0 0 0 |
| 11 to 12 | 1 [0] 1 0 | 1 1 [1] 0 | 0 0 [1] 1 |
| 12 to 13 | 1 0 1 1 | 1 0 1 0 | 0 0 0 0 |
| 13 to 14 | 1 0 [0] 1 | 1 0 1 [1] | 0 0 0 [1] |
| 14 to 15 | 1 0 0 0 | 1 0 0 1 | 0 0 0 0 |
| 15 to 15 | 1 0 0 0 | 1 0 0 0 | 1 1 1 1 |
| 15 to 14 | 1 0 0 1 | 1 0 0 0 | 0 0 0 0 |
| 14 to 13 | 1 0 [1] 1 | 1 0 0 [1] | 0 0 0 [1] |

68

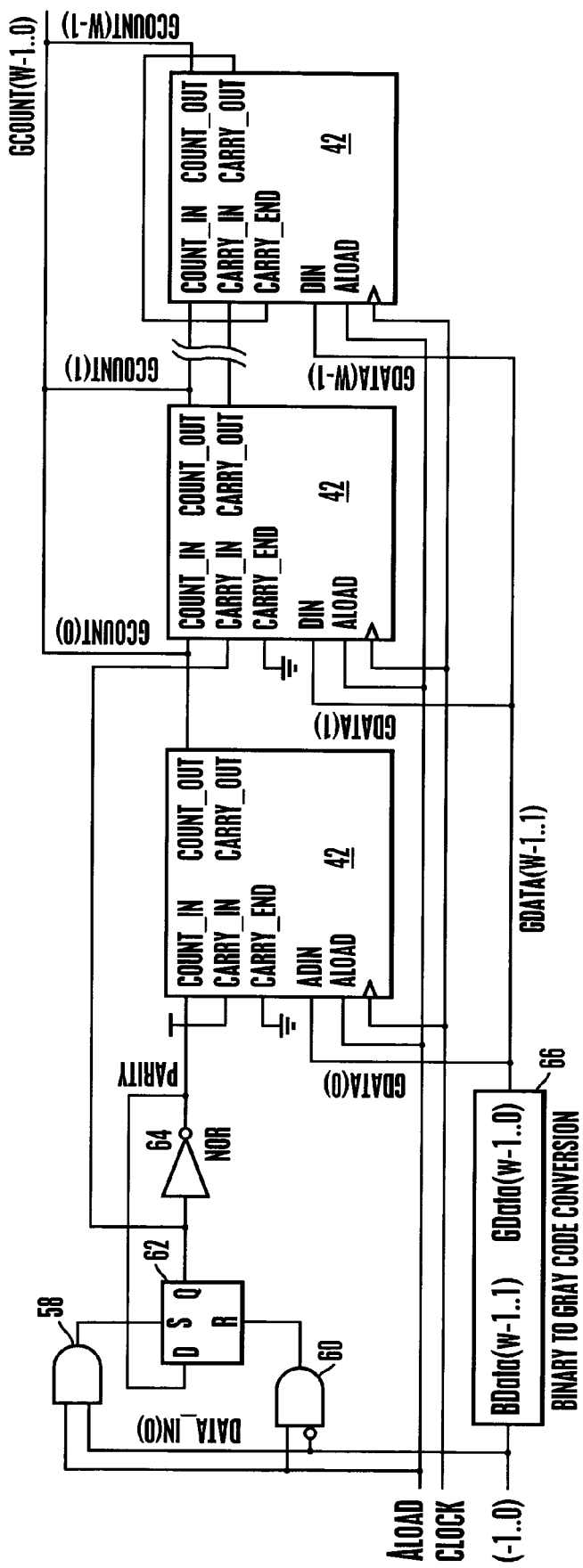
Fig. 4 - Gray Counter w - 1 Stages

SCALABLE GRAY CODE COUNTER

I. FIELD OF THE INVENTION

The present invention relates generally to Gray code counters.

II. BACKGROUND OF THE INVENTION

Counters are used in many computer applications. One example is keeping track of data flow into and out of a data buffer. As an example application, a buffer such as an asynchronous FIFO (First In First Out) buffer can be used to transfer data between two processors that have different clock speeds, for instance, between the main processor of a personal digital assistant (PDA) and a wireless communication processor in the PDA that is used to communicate with, e.g., the Internet. A FIFO essentially removes protocol overhead and data delivery time issues that are present in such applications. FIFO=s are especially useful in EMI sensitive systems such as, for example, a PDA that has a communication processor which is sensitive to electrical noise.

Counters are necessary in such applications so that it can be determined if the buffer is full, partially full compared to a threshold, partially empty compared to another threshold, and completely empty. These determinations can be used to properly establish various communication and data processing parameters.

A common counter is the binary counter, which simply counts, using binary math, how many bits it "sees" going into or out of an associated buffer. As recognized by the present invention, however, in an application requiring low electrical noise, such as the above-mentioned communication processor application, binary counters suffer from the drawback that in certain transitions between counts, a relatively large amount of electrical noise can be generated. For instance, when a binary counter is reset from its maximum value to zero, all the bit values in the counter transition simultaneously from one to zero, generating a relatively large amount of electrical noise.

Gray code counters, in contrast, are counters that never have more than one bit change in a single clock cycle. That is, a Gray code counter can be desired because only one bit of the count is allowed to change on each clock edge, whereas as mentioned above with a binary count the number of bits that change is from one up to the width of the counter. Furthermore, Gray coded counters also offer the best metastable characteristics in asynchronous FIFO designs due to the minimal spread of bit transitions across time, thereby minimizing or completely eliminating unwanted spurious comparator outputs and attendant spurious FIFO flag generation and resetting.

The present invention further understands, however, that implementing a Gray code counter in logic is not as trivial as implementing a simple binary counter. Indeed, the logic resources required to do so, and the performance subsequently achieved, can vary considerably between compilers. Specifically, while optimization of a Gray code counter can be achieved when the reset value of the counter is known, problems arise when the counter is made generic in width and has a reset value that is undetermined at compile time.

One method of guaranteeing that the implementation functions correctly is to use explicit lines of logic code that define the state of the counter after each clock edge, but this method is at the mercy of the compiler=s optimizer to ensure the most efficient use of logic. In addition, it is extremely difficult to write generic code for a scalable counter that uses such explicit instructions. Nevertheless, such a generic Gray code counter is desirable because in many applications the reset value can and does change, depending, for instance, on changing universal asynchronous receiver/transmitter (UART) speed during operation.

SUMMARY OF THE INVENTION

A data bit counter having a width "w" includes 0 to w-1 counter stages. Each stage receives a carry bit and a count bit, optionally a data in signal, with each stage executing logic on the count bit and carry bit (and if desired, on the data in signal) to output a count bit and a carry bit to the next highest stage. The count bits output by the stages together represent a Gray counter count value.

In non-limiting implementations the counter can be embodied on a field programmable gate array that in turn can be implemented in a computer device having a main processor and a communication processor.

As set forth further below, in the preferred embodiment the logic for outputting a carry bit may include determining an AND between an input carry bit and an inverted input count bit. In one preferred logic scheme, an $n^{th}$ count bit, gcount(n), has a value of gcount(n)□ after an active clock edge associated with the counter, and the logic includes determining gcount(n)□ using an XOR of a current count bit and (an AND of a previous count bit and a previous carry bit, where previous refers to the next less significant bit in the count chain). In other words, the logic includes changing a Gray code counter bit when both the previous count bit and previous carry bit have values equal to one.

The carry bit that is output by the last stage establishes a carry end bit which is useful for resetting a most significant Gray count bit. The preferred non-limiting reset logic may include determining an XOR of a current count bit with various logical operations on the current carry bit and remaining bits.

In another aspect, a computing device includes a main processor, a communication processor, and a data buffer between the processors for transferring data there between. A Gray code counter is associated with the buffer. The counter is generic in width and has a reset value that is undetermined at compilation.

In still another aspect, a logic device executes method acts for counting a number of bits processed. The logic includes generating a carry bit chain useful for determining which, if any, higher order bits should change in the next clock cycle. The logic also includes generating a count bit chain. The chains are dependent on each other. The count bit chain is used to indicate a count of a number of bits.

The details of the present invention, both as to its structure and operation, can best be understood in reference to the accompanying drawings, in which like reference numerals refer to like parts, and in which:

BRIEF DESCRIPTION OF THE DRAWINGS

FIG. 1 is a block diagram of processors using a buffer for data transfer, with the buffer using the present counter, as an example of one non-limiting application of the present counter;

FIG. 2 shows an exemplary buffer that uses the Gray code counters of the present invention;

FIG. 3 is a logic diagram of one stage of the present counter;

FIG. 4 is a logic diagram of cascaded stages of the present counter; and

DETAILED DESCRIPTION OF THE PREFERRED EMBODIMENT

Figure 5:
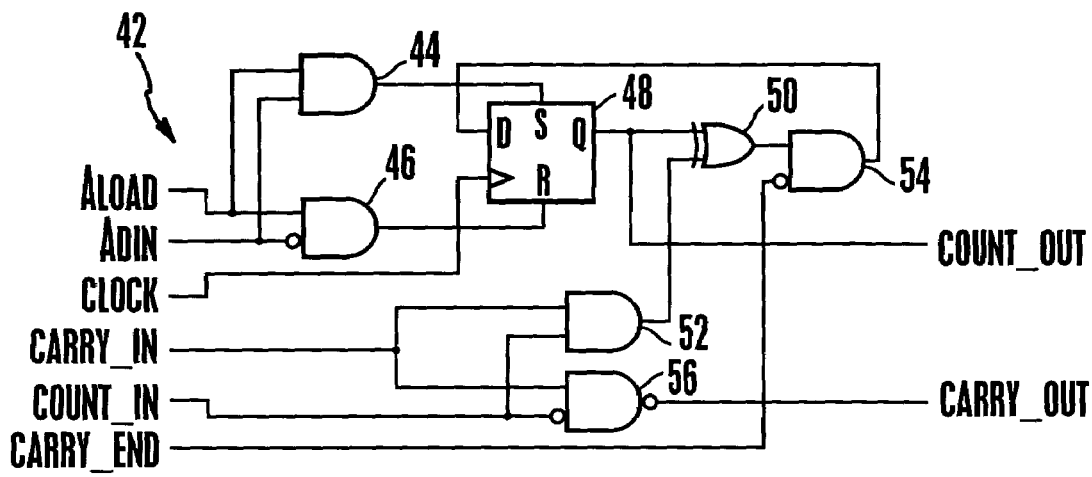
FIG. 5 is a table showing the results of the present counter.

Referring initially to FIG. 1, a first in first out (FIFO) buffer 10 is shown by way of non-limiting illustration of one application in which the present generic Gray code counter can be used. In the example shown in FIG. 1, the FIFO buffer 10 effects data transfer between a write processor 12, such as, e.g., a wireless communication processor, and a read processor 14 such as, e.g., a main processor of a computing device. In one illustrative example the write processor 12 is a code division multiple access (CDMA) processor contained in a personal digital assistant (PDA) having as its principal processor the read processor 14. For communication from the read processor 14 to the write processor 12 (i.e., for duplex communication in which the read-write roles are reversed), a second FIFO buffer (not shown) can be provided.

As shown in FIG. 1, data is sent into the buffer 10 from the write processor 12 and is output to the read processor 14. FIG. 1 indicates that the processors 12, 14 input respective threshold values for determining when the buffer 10 is partially (more than half) full and partially (more than half) empty are input. Signals indicating whether the buffer 10 has actually achieved these states can be output from the buffer 10 to the processors 12, 14 for communication management purposes known in the art. Also, signals indicating whether the buffer 10 has actually become completely full or completely empty can be output from the buffer 10 to the processors 12, 14 for communication management purposes known in the art. These signals are generated using comparisons between the counts of various Gray code counters associated with the buffer 10. Also, so-called "push" and "pop" signals, respectively representing write and read commands from the processors 12, 14, are sent to the buffer 10 to respectively cause the buffer 10 to execute write and read data transfers.

FIG. 2 shows, for illustration purposes, the FIFO buffer 10 in greater detail. As shown, the buffer 10 may have a dual port memory 16 through which data is transferred. Gray Code counters 38, 40 are used for the address lines of the memory. On reset these counters receive a calculated value for the desired FIFO size. For example if the push counter takes a value of 0, then the pop counter would be initialized with a gray coded value of $2^w$ □FIFO size, (for up count implementation). The full and empty flags can be generated from a comparison of the push and pop addresses.

Additionally, the buffer 10 may include additional logic to allow for metastable issues when using asynchronous clocks. This might include shifting the gray coded push and pop address counters through one or more shift registers (not shown), and having multiple stages to the generation and reset of the empty and full flags.

The buffer 10 includes, from the top of FIG. 2, Gray code converters 18, 20 for respectively receiving the partially full and partially empty threshold signals discussed above and converting them to Gray code value. These converted threshold signals are sent to respective Gray code counters 22, 24, the outputs of which can be sent to comparator logic circuits 26, 28 for comparison respectively with the pop and push addresses to generate signals indicating whether the buffer 10 has actually achieved the partially full or partially empty states for output of this information to the processors 12, 14. It may not be necessary to design in robustness against metastability in this case, if the implemented communication protocol uses these signals to enhance performance, but not to rely on their integrity.

Any of the Gray code counters 22, 24, 38, 40 shown in FIG. 2 can be implemented by the counter 42 disclosed below.

FIG. 3 shows a logic diagram of a single stage of a Gray code counter 42 in accordance with the present invention. It is to be understood that the logic shown herein can be implemented in logic circuits or software, such as on a field programmable gate array or application specific integrated circuit. It is to be further understood that the logic at design time may differ from that after compilation and optimization. In other words, after the optimizer has worked on the VHDL code or schematic entry, the carry and count chains are likely to be collapsed to the extent where the individual signals from each module may be indistinguishable. However, the skilled artisan will recognize that the underlying structure of the counter design remains the same as or equivalent to the below-described pre-compilation code.

As shown in FIG. 3, a load signal("ALOAD"), which can be a reset operation signal, is input to an AND gate 44 and a NAND gate 46. Also, a data in ("ADIN") signal is input to the gates 44, 46, indicating the desired load or reset value of this bit of the counter. The outputs of the gates 44, 46, along with a clock signal, are respectively input to the set and reset ports of a flip flop 48. The data out port ("Q") of the flip flop 48 represents an output counter bit of the single stage shown in FIG. 3.

Moreover, the data output port is connected to the input of an XOR gate 50. The XOR gate 50 performs an XOR operation between this input and a second input received from an AND gate 52. It can be readily appreciated in reference to FIG. 3 that the output of the AND gate 52 represents the results of an AND operation between an input carry bit ("carry_in") and an input count bit ("count_in"). The output of the XOR gate 50 is sent to a NAND gate 54, which performs a NAND operation on this input and on a second input received, as shown, as an inverted output of a NAND gate 56. The inverted output of the NAND gate 56 ("carry_out") represents an output carry bit of the single stage shown in FIG. 3, and is the result of inverting a NAND operation result on the carry_in and count_in inputs received by the NAND gate 56.

FIG. 3 shows that the NAND gate 54 performs a NAND operation on the output of the XOR gate 50 and a carry_end signal, discussed further below. The output of the NAND gate 54 is sent back to the data port "D" of the flip flop 48 as shown.

Having described a one bit Gray code counter 42 in FIG. 3, attention is now directed to FIG. 4, which shows how (0 to w-1) one bit counters 42 may be cascaded to establish a Gray code counter of width "w". As shown, the full Gray code counter includes an AND gate 58, NAND gate 60, flip flop 62, and NOT gate 64 arranged as shown to receive ALOAD and initial binary data in (ADIN(0)) signals and generate a parity bit that is input to the bit 0 stage counter 42 as the initial count_in input. If desired, the flip flop 62 could be loaded with the inverted version of binary data_in (0), in which case a DOWN Gray code counter would be generated. Otherwise, the counter counts up. A binary to Gray code converter 66 converts actual data being written to Gray code by XORing binary bits n and n+1 to generate gray code bit n. The most significant bit is the same for Gray code and binary.

Each resulting Gray code data bit is input into the "ADIN" pin of the corresponding stage 42 as shown. That is, the zeroeth Gray code bit is input to the zeroeth stage 42, the second Gray code bit from the converter 66 is input to the second stage, and the $(w-1)^{th}$ bit from the converter 66 is input to the $(w-1)^{th}$ stage. Each stage 42 also receives the ALOAD input as described above, and outputs its carry_out and count_out values to the next successive stage as that stage's carry_in and count_in bits. An exception to this is bit 1 which takes its carry_in from the non inverted output of the flip-flop 62, and subsequently bit 0 has a redundant carry chain that is removed upon logic optimization by fixing its carry_in signal at a logic 1. Subsequent stages 42 are identical except that the last $(w-1)^{th}$ stage connects its carry_out bit to its carry_end pin for purposes to be shortly disclosed, with the remaining stages simply grounding out their carry_end inputs. The combined count_out values of the stages 42 represent the Gray counter count.

The logic embodied by the exemplary non-limiting circuits shown above can be written as:

Carry(n)=NOT(Gray_count(n-1)) AND Carry(n-1), wherein n is the bit number in the counter, in the range 1 to w-1. In other words, the carry chain progresses to the next bit when all of the lower order counter bits are zero and lower order carry bits are one.

If the output of the nth bit after an active clock edge is n=, and n is In the range 1 to w B1, then:

Gray_count(n)☐=Gray_count(n) XOR (Gray_count(n-1) AND Carry (n-1)). In other words, a Gray code counter bit toggles (changes) when both of the next lower order count and carry bits are equal to one.

The table 68 in FIG. 5 shows this for a Gray code counter of width=4. More specifically, the shaded numbers show a carry bit and count bit effecting a change in the result of higher order count bits. Every other clock, no carry bits exact a change, but in this case the least significant bit will toggle.

Note that when the count reaches the highest number (in the case of a 4-bit counter, 15) it stalls and then reverses. However, as mentioned above the Carry_count output by the last stage is input to the carry_end terminal of the stage, to reset the upper gray count bit, thus rolling the count over to 0. Now, the most significant bit is defined by: Gray_count(w-1)☐=Gray_count(w-1) XOR (Gray_count(n-2) AND Carry (w-2)) AND NOT(Carry(w-1)).

Set forth below is one non-limiting implementation in VHDL of the logic discussed above. Gray_module represents the one bit stage shown in FIG. 3. The Gray_counter module contains the logic required to perform asynchronous load, synchronous load, and up and down counting. In some applications, not all of these features will be required, in which case the unused inputs may be replaced by internal signals. For a down counting counter, the following two conditions must be satisfied:

Gray_count(w-1)☐=Gray_count(w-1) OR carry(w-1), and

LOAD Initialization of Carry(0)=NOT(LOAD_DATA(0)).

This can be accomplished by combining the logic with a latched version of the UP_DOWNN input in the code.

Gray Code Counter In VHDL

```
LIBRARY ieee;
USE ieee.std_logic_1164.all;
ENTITY Gray_Counter IS
   GENERIC (WIDTH: INTEGER:=32);    --default 32 bit wide counter.
   PORT
   (
     CLK : IN STD_LOGIC;
     ALOAD : IN STD_LOGIC:='0';
     SLOAD : IN STD_LOGIC:='0';
     UP_DOWNN: IN STD_LOGIC:='0';
     EN: IN STD_LOGIC:='1';
     ALOAD_DATA : IN STD_LOGIC_VECTOR(WIDTH-1 downto 0):=(others=>'0');
     SLOAD_DATA : IN STD_LOGIC_VECTOR(WIDTH-1 downto 0) :=(others=>'0');
     COUNT : OUT STD_LOGIC_VECTOR(WIDTH-1 downto 0)
   );
END Gray_Counter;
ARCHITECTURE Gray_Counter_architecture OF Gray_Counter IS
COMPONENT Gray_Module IS
     PORT ( CLK       :IN    STD_LOGIC;
        EN           :IN  STD_LOGIC;
        ALOAD        :IN  STD_LOGIC;
        SLOAD        :IN  STD_LOGIC;
        ADIN         :IN  STD_LOGIC;
        SDIN         :IN  STD_LOGIC;
        GCOUNT_IN    :IN    STD_LOGIC;
        CARRY_IN     :IN  STD_LOGIC;
        CARRY_END    :IN    STD_LOGIC;
        UP_DOWNN     :IN    STD_LOGIC;
        GCOUNT_OUT   :OUT STD_LOGIC;
        CARRY_OUT    :OUT STD_LOGIC
    );
END COMPONENT Gray_Module;
--Optional internal module assignment to load and up down usage for better logic utilization
--To enable internal signal, remove from port list first. Not some compilers may complain
--about assigning variable WIDTH with (others=>'0'). In this case replace with full binary string.
--SIGNAL ALOAD : STD_LOGIC:='0';
--SIGNAL SLOAD : STD_LOGIC:='0';
--SIGNAL UP_DOWNN: STD_LOGIC:='0';
```

-continued

Gray Code Counter In VHDL

```
--SIGNAL ALOAD_DATA : STD_LOGIC_VECTOR(WIDTH-1 downto 0):=(others=>'0');
--SIGNAL SLOAD_DATA : STD_LOGIC_VECTOR(WIDTH-1 downto 0):=(others=>'0');
SIGNAL gcount_int: std_logic_vector (WIDTH-1 downto 0);
SIGNAL gcount_minus1: std_logic;                    --parity bit
SIGNAL carry: std_logic_vector (WIDTH-1 downto 0);
SIGNAL AGRAY_DATA: std_logic_vector (WIDTH-1 downto 0);
SIGNAL SGRAY_DATA: std_logic_vector (WIDTH-1 downto 0);
SIGNAL UP_DOWNN_LATCH:std_logic;
BEGIN
   ASSERT WIDTH>3;
   -- Recursively generate the binary to Gray code conversion
   gray_convert:FOR index IN 0 to WIDTH-2 GENERATE
      AGRAY_DATA(index)<=ALOAD_DATA(index) XOR ALOAD_DATA(index+1);
      SGRAY_DATA(index)<=SLOAD_DATA(index) XOR SLOAD_DATA(index+1);
   END GENERATE;
   -- add the MSB binary to Gray code conversion
   AGRAY_DATA(WIDTH-1)<=ALOAD_DATA(WIDTH-1);
   SGRAY_DATA(WIDTH-1)<=SLOAD_DATA(WIDTH-1);
   -- Recursively generate the middle bits of the counter
   countarray:FOR index IN 1 to WIDTH-2 GENERATE
   begin
      gmodule:component Gray_Module
      port map(  CLK=>CLK,
                 EN=>EN,
                 ALOAD=>ALOAD,
                 SLOAD=>SLOAD,
                 ADIN=>AGRAY_DATA(index),
                 SDIN=> SGRAY_DATA(index),
                 GCOUNT_IN => gcount_int(index-1),
                 CARRY_IN =>carry(index-1),
                 CARRY_END=>'0',
                 UP_DOWNN=>'0',
                 GCOUNT_OUT=>gcount_int(index),
                 CARRY_OUT=>carry(index)
                 );
   END GENERATE;
--The parity bit is a Toggle flip flop
bit_minus1:process (CLK,EN,ALOAD, SLOAD, UP_DOWNN ,ALOAD_DATA(0), SLOAD_DATA(0))
begin
   if ALOAD='1' and ALOAD_DATA(0)='0' then
        carry(0)<=NOT(UP_DOWNN);
   elsif ALOAD ='1' and ALOAD_DATA(0)='1' then
        carry(0)<= UP_DOWNN;
   elsif rising_edge(CLK) then
        if SLOAD='1' then
          carry(0)<=NOT(UP_DOWNN XOR SLOAD_DATA(0));
        elsif EN='1' then
          carry(0)<=not(carry(0));
        end if;
   end if;
end process bit_minus1;
--Can only change direction of counter during a load cycle, so latch UP_DOWNN bit.
updownlatchprocess:process (UP_DOWNN,ALOAD,SLOAD,CLK)
begin
   if ALOAD='1' AND UP_DOWNN='0' then
        UP_DOWNN_LATCH<='0';
   elsif ALOAD='1' AND UP_DOWNN='1' then
        UP_DOWNN_LATCH<='1';
   elsif rising_edge(CLK) then
        if SLOAD='1' then
          UP_DOWNN_LATCH<=UP_DOWNN;
        end if;
   end if;
end process updownlatchprocess;
--The LSB is connected differently from the other bits,
--so is not generated recursively
gcount_minus1<=not(carry(0));
countarray0:component Gray_Module
        port map( CLK=>CLK,
          EN=>EN,
          ALOAD=> ALOAD,
          SLOAD=>SLOAD,
          ADIN=>AGRAY_DATA(0),
          SDIN=>SGRAY_DATA(0),
          GCOUNT_IN => gcount_minus1,
          CARRY_IN =>'1',
          CARRY_END=>'0',
```

-continued

Gray Code Counter In VHDL

```
            UP_DOWNN=>'0',
            GCOUNT_OUT=>gcount_int(0),
            CARRY_OUT=>dummy
        );
--The MSB includes the wiring to teminate and rollover the counter
countarraywminus1:component Gray_Module
        port map(    CLK=>CLK,
            EN=>EN,
            ALOAD=> ALOAD,
            SLOAD=>SLOAD,
            ADIN=>AGRAY_DATA(WIDTH-1),
            SDIN=>SGRAY_DATA(WIDTH-1),
            GCOUNT_IN => gcount_int(WIDTH-2),
            CARRY_IN =>carry(WIDTH-2),
            CARRY_END=>carry(WIDTH-1),
            UP_DOWNN=>UP_DOWNN_LATCH,
            GCOUNT_OUT=>gcount_int(WIDTH-1),
            CARRY_OUT=>carry(WIDTH-1)
        );
    COUNT<=gcount_int;
END Gray_Counter_architecture;
LIBRARY ieee;
USE ieee.std_logic_1164.all;
ENTITY Gray_Module IS
    PORT (
        CLK           :IN      STD_LOGIC;
        EN            :IN      STD_LOGIC;
        ALOAD         :IN      STD_LOGIC;
        SLOAD         :IN      STD_LOGIC;
        ADIN          :IN      STD_LOGIC;
        SDIN          :IN      STD_LOGIC;
        GCOUNT_IN        :IN   STD_LOGIC;
        CARRY_IN      :IN      STD_LOGIC;
        CARRY_END        :IN   STD_LOGIC;
        UP_DOWNN         :IN   STD_LOGIC;
        GCOUNT_OUT       :OUT  STD_LOGIC;
        CARRY_OUT     :OUT STD_LOGIC
        );
END ENTITY Gray_module;
ARCHITECTURE Gray_module_arch OF Gray_module IS
SIGNAL gcount_int,gcount_int2,gcount_int3, carry_end1, carry_end2: STD_LOGIC;
BEGIN
    gcount_int2<=GCOUNT_IN AND CARRY_IN;
    gcount_int3<=gcount_int XOR gcount_int2;
    carry_end1<=UP_DOWNN NAND CARRY_END;
    carry_end2<=NOT(UP_DOWNN) AND CARRY_END;
    process (CLK, EN, ADIN, ALOAD, GCOUNT_IN, CARRY_IN)
    BEGIN
        if ALOAD='1' and ADIN='0' then
            gcount_int<='0';
        elsif ALOAD='1' and ADIN='1' then
            gcount_int<='1';
        elsif rising_edge(CLK) then
            if SLOAD='1' then
            gcount_int<=SDIN;
            elsif EN='1' then
            gcount_int<=(gcount_int3 AND carry_end1) or carry_end2;
            end if;
        end if;
    end process;
    CARRY_OUT<='1' when GCOUNT_IN='0' AND CARRY_IN='1' else '0';
    GCOUNT_OUT<=gcount_int;
END Gray_module_arch;
```

While the particular SCALABLE GRAY CODE COUNTER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. '112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

What is claimed is:

1. A data bit counter having a width "w", comprising:
at least w counter stages, each stage receiving at least one carry bit, and at least one count bit, each stage executing logic on the count bit and carry bit to output at least one count bit and at least one carry bit to a next highest stage, the count bits output by the stages together representing a Gray counter count value, wherein; an $n^{th}$ count bit has a value of gcount(n)' after an active clock edge associated with the counter, and the logic includes determining gcount(n)' using an XOR of a current count bit and an output of AND of a previous count bit and a previous carry bit.

2. The counter of claim 1, wherein the counter is embodied on at least one of: a field programmable gate array, and an application specific integrated circuit (ASIC).

3. The counter of claim 2, wherein the gate array is implemented in a computer device having at least a main processor and at least a communication processor communicating therewith.

4. The counter of claim 1, wherein the logic for outputting a carry bit includes determining an AND between an input carry bit and an inverted input count bit.

5. The counter of claim 4, wherein the logic includes changing a Gray code counter bit when both the previous count bit and previous carry bit have values equal to one.

6. The counter of claim 1, wherein a carry bit output by a last stage establishes a carry end bit useful for rescuing a most significant Gray count bit.

7. The counter of claim 6, comprising logic for executing the resetting act, the logic including determining an XOR of a current count bit with at least one other bit.

8. A computing device, comprising:
at least one main processor;
at least one communication processor;
at least one data buffer between the processors for transferring data there between; and
at least one Gray code counter associated with the buffer, the counter being generic in width and having a reset value that is undetermined at compilation, wherein an $n^{th}$ count bit has a value of gcount(n)' after an active clock edge associated with the counter, and the logic includes determining gcount(n)' using an XOR of a current count bit with at least one other bit.

9. The device of claim 8, wherein the counter has a width "w" and includes at least w counter stages, each stage receiving at least one carry bit and at least one count bit, each stage executing logic on the count bit and carry bit to output at least one count bit and at least one carry bit to a next highest stage, the count bits output by the stages together representing a Gray counter count value.

10. The device of claim 9, wherein the counter is embodied on at least one of: a field programmable gate array, and an application specific integrated circuit (ASIC).

11. The device of claim 9, wherein the logic for outputting a carry bit includes determining an AND between an input carry bit and an inverted input count bit.

12. The device of claim 8, wherein a carry bit output by a last stage establishes a carry end bit useful for resetting a most significant Gray count bit.

13. The device of claim 12, the counter comprising logic for executing the resetting act, the logic including determining an XOR of a current count bit with at least one other bit.

14. A logic device executing method acts for counting a number of bits processed, the method acts comprising:
generating a carry bit chain useful for determining which, if any, higher order bits should change in a next clock cycle;
generating a count bit chain, the chains being dependent on each other; and
using the count bit chain to indicate a count of a number of bits, the device including a Gray code counter using the chains, wherein the counter has a width "w" and includes at least w counter, each stage receiving at least one carry bit, and at least one count bit, each stage executing logic on the count bit and carry bit to output at least one count bit and at least one carry bit to a next highest stage, the count bits output by the stages together representing a Gray counter count value further wherein an $n^{th}$ count bit has a value of gcount(n)' after an active clock edge associated with the counter, and the logic includes determining gcount(n)' using an XOR of a current count bit and an output of AND of a previous count bit and a previous carry bit.

15. The device of claim 14, wherein the counter is embodied on at least one of: a field programmable gate array, and an application specific integrated circuit (ASIC).

16. The device of claim 15, wherein the gate array is incorporated into a device having a main processor communicating with a communication processor.

17. The device of claim 14, wherein the logic for outputting a carry bit includes determining an AND between an input carry bit and an inverted input count bit.

18. The device of claim 14, wherein a carry bit output by a last stage establishes a carry end bit useful for resetting a most significant Gray count bit.

19. The device of claim 18, the counter comprising logic for executing the resetting act, the logic including determining an XOR of a current count bit with (an output of an AND of an inverted current carry bit and an (AND of a next lower order count bit and a previous carry bit)).

* * * * *